Figure 1:
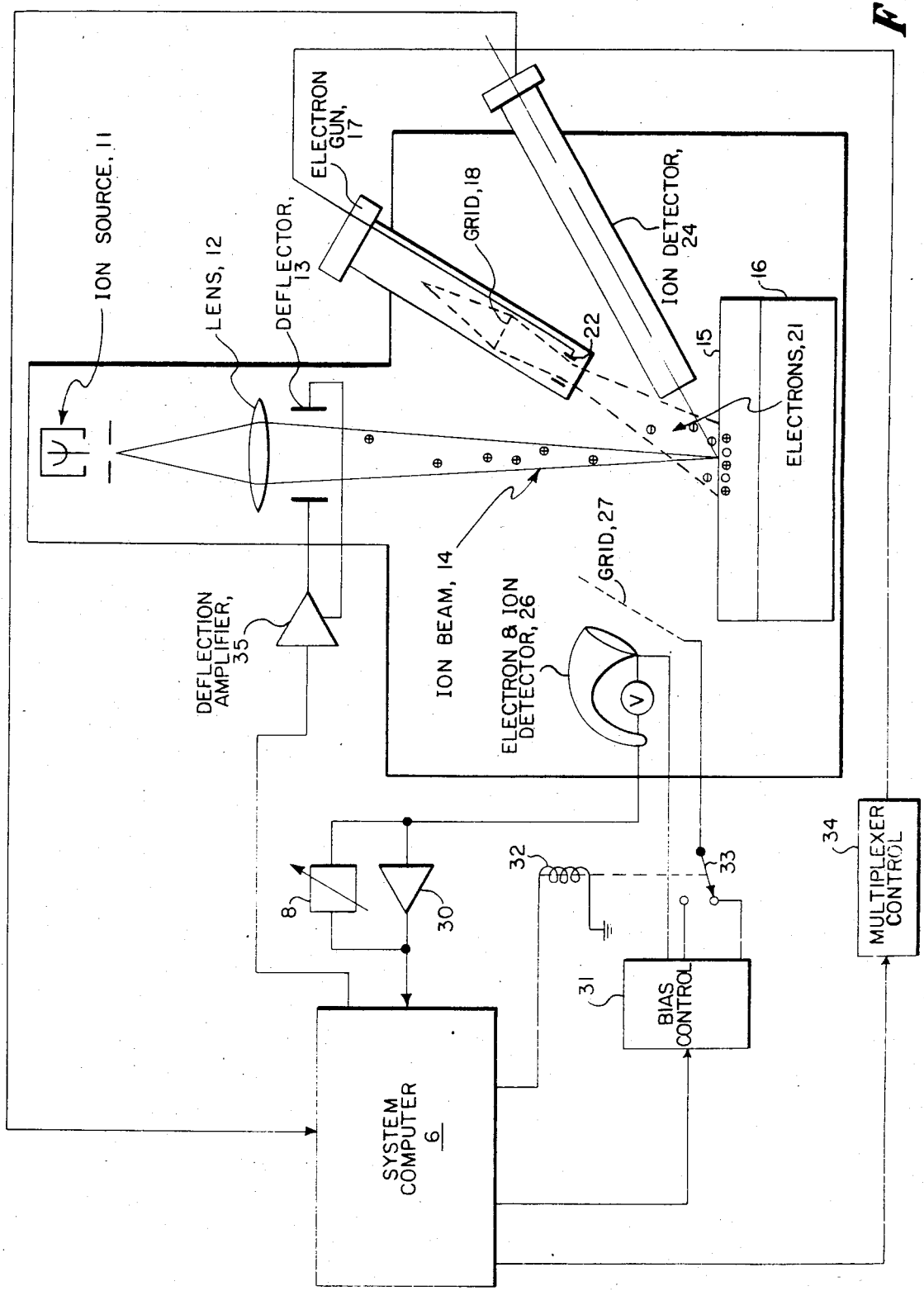

United States Patent [19]

Doherty et al.

[11] Patent Number: 4,639,301
[45] Date of Patent: Jan. 27, 1987

[54] FOCUSED ION BEAM PROCESSING

[75] Inventors: John A. Doherty, Sudbury; Billy W. Ward, Rockport; David C. Shaver, Carlisle, all of Mass.

[73] Assignee: Micrion Limited Partnership, Beverly, Mass.

[21] Appl. No.: 726,713

[22] Filed: Apr. 24, 1985

[51] Int. Cl.⁴ ............................................. C23C 14/00
[52] U.S. Cl. ................................ 204/192.31; 156/643; 204/192.34; 204/298; 250/251; 250/396 ML; 250/398; 250/425; 250/427; 250/492.3
[58] Field of Search ................ 250/427, 398, 396 ML, 250/492.3, 251, 425; 156/643; 204/192 E, 192 N, 298

[56] References Cited

U.S. PATENT DOCUMENTS

| 3,699,334 | 10/1972 | Cohen et al. | 250/398 |
|---|---|---|---|
| 4,418,283 | 11/1983 | Trotel | 250/398 |
| 4,457,803 | 7/1984 | Takigawa | 204/192 E |
| 4,463,255 | 7/1984 | Robertson | 250/251 |
| 4,464,839 | 8/1984 | Dathe et al. | 204/192 N |
| 4,479,060 | 10/1984 | Tamura et al. | 250/398 |
| 4,541,890 | 9/1985 | Cuomo et al. | 204/192 E |
| 4,549,082 | 10/1985 | McMillan | 250/427 |

OTHER PUBLICATIONS

Harper et al., IBM Tech. Disc. Bull., 23 (1980), Oct., pp. 2143-2146.
Aisenberg et al., J. Vac. Sci. Technol., 10 (1973), pp. 104-107.

Primary Examiner—Arthur P. Demers
Attorney, Agent, or Firm—Charles Hieken

[57] ABSTRACT

An apparatus is described which makes possible the precise sputter etching and imaging of insulating and other targets, using a finely focused beam of ions produced from a liquid metal ion source. This apparatus produces and controls a submicron beam of ions to precisely sputter etch the target. A beam of electrons directed on the target neutralizes the charge created by the incident ion beam. Imaging of the target surface and ultra-precise control of the etching process is achieved by monitoring the particles that are sputtered from the target surface.

15 Claims, 2 Drawing Figures

FOCUSED ION BEAM PROCESSING

The present invention relates in general to focused ion beam processing and more particularly concern the use of a submicron focused ion beam to sputter etch and image in a precise and highly controlled manner targets that retain electrical charge, such as non-conductors, semiconductors or conductors isolated from electrical ground. This invention embodies a unique way to repair optical and ion masks and x-ray lithography masks and reticles.

The principal technical difficulty with etching and imaging of insulators and other charging targets is associated with the inability of these targets to drain the charge that is deposited by the ion beam during the etching process. The local potential may reach nearly the potential of the incident beam to seriously degrade the beam shape. The beam position will then no longer be a reliable function of the electronic driving signals.

A search of subclasses 251, 281, 310, 423, 427, 492.2 and 492.3 of class 350, subclass 643 of class 156 and subclass 942 of class 430 uncovered U.S. Pat. Nos. 3,219,817, 3,665,185, 3,845,305, 3,878,392, 4,052,614, 4,249,077, 4,381,453, British Specification No. 999,380 and a publication of Helmut Liebl entitled DESIGN OF A COMBINED ION AND ELECTRON MICROPROBE APPARATUS in Int. J. Mass. Spectrom. Ion Phys., 6 Nos. 5-6 (1971), pp. 401-412. Other prior art uncovered includes U.S. Pat. Nos. 3,665,185, 3,920,989, 4,249,077, 4,361,762, 4,447,724, 4,463,255, 4,453,078, 3,920,989, 4,249,077, 4,361,762 and 4,447,724 and references cited therein. The most pertinent of these is believed to be U.S. Pat. No. 4,463,255 identifying electron flooding as the known technique for charge neutralization.

According to the invention, there is a source of a finely focused beam of ions for precisely sputter etching a target, a source of electrons, and means for directing the electrons upon the target to neutralize the ion beam charge on the target to allow precise positioning of the ion beam and maintenance of its submicron shape on the target. According to another aspect of the invention, means are provided for monitoring particles sputtered from the target surface for controlling the process of etching the target.

Figure 2:
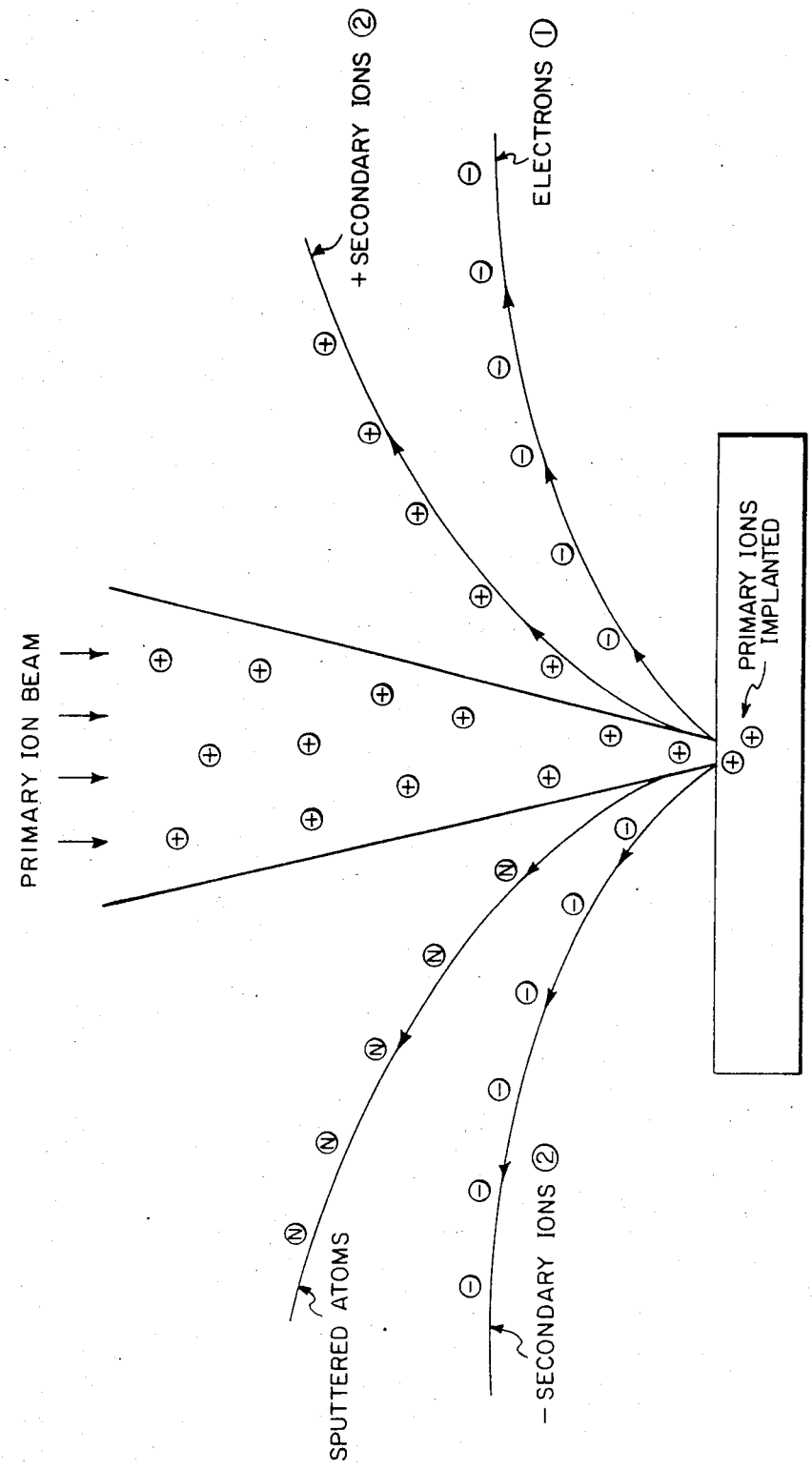

Numerous other features, objects and advantages of the invention will become apparent from the following specification when read in connection with the accompanying drawing in which:

FIG. 1 is a combined block-pictorial diagram of a system according to the invention; and FIG. 2 is a schematic representation of the etching process according to the invention.

With reference now to the drawing and more particularly FIG. 1 thereof, there is shown a combined block-pictorial representation of a system according to the invention. The system includes an ion source 11 providing ions focused by a lens 12 to form a finely focused ion beam 14 that is deflected by deflecting plates 13 to impinge upon surface 15 of substrate 16. A low energy electron gun 17 has an electron source, a control grid 18 and an extraction electrode 22 that permit a low energy (less than 1,000 V) beam of electrons to bathe a portion of surface 15 surrounding the point where ion beam 14 is sharply focused upon surface 15. Control element 22 may receive signals through multiplexer control 34 for deflecting or blanking the flooding electron beam.

An ion detector 24 detects ions sputtered from surface 15 to provide a signal to system computer 6. Electron and ion detector 26 may detect electrons and ions sputtered from surface 15 through grid 27 when grid 27 is appropriately biased to provide a signal through operational amplifier 30 that is also applied to system computer 6. System computer 6 controls bias control 31 and relay 32 connected to its arm 33 to selectively connect grid 27 to ion selective or electron selective potentials provided on correspondingly designated terminals of bias control 31. The potentials at the front of electron and ion detector 26 and grid 27 can be controlled to allow the detection of electrons or ions. Typically ion detection would be achieved by biasing the front of the detector 26 at $-2000$ V to $-4000$ V and the grid 27 at a potential of the $+50$ V to $-300$ V. Secondary electron detection can be achieved with potentials in the range of 0 to $+200$ V on either or both of grid 27 and detector 26. Other potentials might be used to limit collected particles to those with lower or higher energies. Multiplexer control 34 may provide a beam control signal to grid 18 of electron gun 17. System computer 6 may also provide a deflection signal to deflection amplifier 35 that energizes deflection plates 13.

The components of the system are known in the art and not described in detail herein to avoid obscuring the principles of the invention. For example, the ion source 11 may be one commercially available from FEI Company of Beaverton, Oreg. The low energy electron gun 17 may be one commercially available from Kimball Physics of Wilton, N.H. The electron and ion detector 26 may comprise a channel electron multiplier or channel electron multiplier array (microchannel plate) commercially available from Galileo of Sturbridge, Mass.

Having described the system arrangement, its mode of operation will be described. The system of FIG. 1 is useful in imaging, neutralizing ion charge and detecting the end point of a sputtering process. To this end ion beam 14 originates from an ion source 11 providing ions that are accelerated and focused by electrostatic lens 12. Deflector 13 may precisely position ion beam 14 over a field of view on surface 15 typically approximately one square millimeter in area.

When ion beam 14 impinges upon surface 15 of substrate 16, a number of events occur.
 (1) Low energy secondary electrons are generated.
 (2) Positive and negative low energy secondary ions are generated.
 (3) Atoms are sputtered away from surface 15.
 (4) Primary ions from beam 14 are implanted into surface 15 and also backscattered from surface 15.

Referring to FIG. 2, there is shown a schematic representation of these processes. Each particle so generated comes only from the area directly beneath ion beam 14; hence, it is important that beam 14 be kept small and precisely located where it meets surface 15. In the apparatus of FIG. 1, electrons, ions and neutral particles may be used to provide precise topological and compositional information relating to the surface under the focused ion beam 14. This information is useful for both surface imaging and determining the rates of sputtering. If substrate 16 is not a conductor, a typical occurrence when etching on a semiconductor or insulating surface, the incident ion charge builds up under the beam and creates an electric field that interferes not only with the ion beam shape at the surface, but also the trajectories of ions and electrons as they leave the surface. A potential of only a few volts modifies these processes. The alteration of the trajectories of these emitted charged particles by target charging can influence the number of particles collected by the detector. This produces changes in the image known as voltage contrast. If controlled, voltage contrast can be used to enhance target images. The invention makes it possible to controllably allow or eliminate voltage contrast.

By bathing the surface 15 around the point of impact from ion beam 14 with electrons from electron gun 17, these electrons neutralize the positive charge of the incident ions and thereby reduce the undesired field produced by the positive ions.

Multiplexer control 34 responds to signals from system computer 6 to provide a signal on electron gun control grid 18 that effectively controls the number of electrons on surface 15 so as to maintain sufficient low energy electrons to establish the desired neutralization. Switchable ion and electron detector 26 measures the number of electrons or ions escaping from surface 15 when grid 27 is biased to allow passage of them to provide electrical signals amplified by operational amplifier 30 of adjustable gain to provide an appropriate signal to system computer 6. System computer 6 monitors these detected signals to control the electron current and timing such that the processes are as unperturbed as practical. By adjusting the electron flow upon surface 15 to neutralize the positive ion charge from beam 14, the processes remain free of disturbances caused by a charged surface.

While the system has been described in association with a system computer that may exercise control in accordance with known techniques, the invention could be practiced exercising the desired control manually. For example, deflection signals could be applied to deflector 13 manually by operating suitable potentiometers, relay 32 could be operated manually to switch between detecting for electrons and ions, and visual indicators, such as meters, could be placed at the output of operational amplifier 30 and scanning ion mass detector 24. The control signals applied to control element 22 could be manually controlled.

Furthermore, instead of displacing ion beam 14 by applying signals to deflector 13, ion beam 14 could remain stationary, and substrate 16 displaced. Substrate 16 could be supported on a mechanical stage, preferably having precision mechanical displacement mechanisms for displacement in mutually orthogonal directions between positions that can be readily determined to facilitate identifying the position where a feature is indicated, typically by a sharp change in detected ion and/or electron current.

Preferably the deflection signals applied to deflector 13 are correlated with the signals received from detector 26 so that changes in detected signal are associated with particular deflection signal amplitudes corresponding to particular locations on the substrate surface 15. Detector 26 may be one of many types such as electron multiplier, microchannel plates, secondary ion mass analyzer, or photon or phonon detectors. In the preferred embodiment of the invention a microchannel plate is used to provide the imaging signal.

The invention is especially useful in repairing optical masks and reticles. Because large areas of the mask or reticle are highly insulating glass, these surfaces are subject to charge accumulation when bombarded by positive ions. The invention neutralizes this charge accumulation.

The invention may be used for opaque repair (removal of light blocking structures), transparent repair (making transmitting areas opaque) and imaging (so that defective areas can be precisely located with respect to the ion beam and other features of the substrate being repaired). All of these operations are enhanced by using the invention to neutralize charge accumulation and facilitate the process. Consider the following examples.

In the opaque repair process, the ion beam is used to sputter away the defect-forming material. Electron charge neutralization is used both in real time and in a multiplexed mode so that both ion imaging and secondary electron imaging may be used to locate the defect and monitor the sputtering process. For example, when the secondary electrons are being used to produce the desired image, the low energy flood electrons in beam 21 are attracted to detector 26, interfering with the desired signal. Hence, depending on the conditions, electron gun 17 is switched on and off in a time division multiplexed way in cooperation with the primary ion beam 14 to simultaneously permit charge neutralization and secondary electron imaging.

For positive ion imaging (used to produce different types of contrast) the electron neutralizer is used concurrently with the primary ion beam 14. This approach is successful because the bias from bias control 31 to grid 27 when relay 32 is operated rejects the negatively charged low energy electrons of the neutralizing beam 21 while accepting secondarily emitted positive ions.

In the repair of opaque defects SIM analyzer 24 may be used to quantitatively determine the types of ions leaving substrate 16. This information is processed by system computer 25 to adjust the etching location of beam 14 to minimize undesired etching of substrate 16, typically glass. Electron neutralization is used during this process in real time in a way analogous to the method of secondary ion imaging described above.

In clear repair a preferred method of producing opaque areas in the glass is to etch various types of optical diffusers as described in a paper by A. Wagner, D. Barr, D. Atwood and J. H. Bruning presented at the seventeenth Electronic, Ion and Photon Beam Symposium in Los Angeles, Calif., in May 1983. This process requires precise and relatively long time etching of the insulating glass surface. Since precise optical elements must be etched, the electron neutralizing beam 21 is concentrated at the area of the ion etching beam 14.

It is unnecessary to focus finely electron flood beam 21, and a neutralizing beam may be used having a current density much less than that of primary ion beam 14. The ion beam current is typically $0.5 \times 10^{-9}$ amps with a density of about 1 amp/cm$^2$. The electron beam current is typically $10^{-6}$ to $10^{-3}$ amps with a current density $10^{-4}$ amps/cm$^2$. The electron beam current is much greater and its current density much less than the current and current density, respectively of the finely focused ion beam. It may be advantageous to use ion beam induced conductivity to assist in charge neutralization. As ion beam 14 is scanned over surface 15, sufficient crystal damage and impurity implantation occurs to produce a thin conductive layer in the upper 10 nanometers of the previously insulating glass substrate 16. This conductive layer does not disturb the desirable optical characteristic of the glass and may provide an increased surface conducting area for flood electrons to reach the area of primary ion beam etching.

There has been described novel apparatus and techniques for neutralizing the surface charge developed on a substrate in response to ion beam bombardment so as to allow maintenance of a sharply focused ion beam on the surface and facilitate imaging and control. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Focused ion beam processing apparatus comprising,
   a source of a finely focused ion beam of submicron shape for impingement upon a substrate surface in a predetermined surface plane,
   a source of an electron beam,
   and means for directing said electron beam toward said surface plane in a region embracing the target point in said surface plane intersected by said ion beam for neutralizing the surface charge in said surface plane otherwise produced thereat by said ion beam to reduce defocusing and undesired deflection of said ion beam in said surface plane to allow precise positioning of said ion beam on said target point and maintenance of said submicron shape of said ion beam on said target point.

2. Focused ion beam processing apparatus in accordance with claim 1 and further comprising,
   detecting means for sensing secondarily emitted particles from said surface plane,
   and control means responsive to signals provided by said detecting means for controlling said ion beam and said electron beam to coact and cause said ion beam to etch in said surface plane in a desired manner and location.

3. Focused ion beam processing apparatus in accordance with claim 2 wherein said detecting means comprises a secondary ion mass detector for sensing the types of ions leaving a substrate in response to impingement on the substrate surface by said ion beam.

4. Focused ion beam processing apparatus in accordance with claim 2 wherein said detecting means comprises an electron and ion detector for detecting electrons and ions secondarily emitted from said surface of a substrate in response to impingement by said ion beam.

5. Focused ion beam processing apparatus in accordance with claim 4 and further comprising grid means interposed between said electron and ion detector and said surface plane for selectively establishing an electric field that prevents electrons from entering said electron and ion detector while allowing ions to enter
   and means for selectively biasing said grid means to establish said electric field.

6. Focused ion beam processing apparatus in accordance with claim 5 and further comprising,
   multiplexer controlling means for controlling the times when said ion beam and said electron beam impinge upon said surface plane to be during mutually exclusive time intervals.

7. Focused ion beam processing apparatus in accordance with claim 1 wherein said ion beam and said electron beam produce currents with the electron beam current and current density being much greater and much less than the ion beam current and current density respectively.

8. Focused ion beam processing apparatus in accordance with claim 1 and further comprising a substrate having said substrate surface in said predetermined surface plane,
   said substrate being predominantly insulating material and responding to impingement of said ion beam upon said surface by developing a thin conductive layer in said surface,
   said conducting surface presenting an increased surface conducting area for flood electrons from said source of an electron beam to reach the area of primary ion beam etching on said surface by said ion beam to neutralize the charge thereat.

9. A method of using the focused ion beam processing apparatus in accordance with claim 1 which method includes the steps of,
   directing said finely focused ion beam of submicron shape upon said substrate surface target point in a predetermined surface plane,
   and directing said electron beam toward said surface plane in a region embracing said target point in said surface plane intersected by said ion beam for neutralizing the surface charge in said surface plane otherwise produced thereat by said ion beam to reduce defocusing and undesired deflection of said ion beam in said surface plane to allow precise positioning of said ion beam on said target point and maintenance of said submicron shape of said ion beam on said target point.

10. A method in accordance with claim 9 and further including the steps of sensing secondarily emitted particles from said surface plane in response to impingement of said ion beam upon said surface to sense characteristics of said surface,
    and positioning said ion beam to etch at a predetermined location on said surface located by observing change in the density of particles being emitted from said surface as said ion beam and said surface are relatively displaced.

11. A method in accordance with claim 10 and further including the step of sensing both secondarily emitted electrons and ions from said surface in response to impingement by said ion beam.

12. A method in accordance with claim 11 and further including the step of controllably charging said substrate surface to allow imaging in a voltage contrast mode affecting the quantity and trajectories of secondary particles to enhance the contrast between materials comprising the substrate.

13. A method in accordance with claim 9 and further including the step of damaging the substrate surface and implanting impurities therein with said ion beam to produce a thin conductive layer substantially in the upper 10 nanometers of said substrate to provide an increased surface conducting area for flood electrons from said ion beam to reach the area of primary ion beam etching by said ion beam upon said surface without disturbing desirable optical characteristics of said substrate.

14. Focused ion beam processing apparatus comprising,
    a source of a finely focused ion beam for impingement upon a substrate surface in a predetermined surface plane,
    a source of an electron beam, means for directing said electron beam toward said surface plane in a region embracing the point in said surface plane intersected by said ion beam for neutralizing the surface charge in said surface plane otherwise produced thereat by said ion beam to reduce defocusing and undesired deflection of said ion beam in said surface plane, said detecting means comprising an electron and ion detector for detecting electrons and ions secondarily emitted from said substrate surface in response to impingement by said ion beam, grid means interposed between said electron and ion detector and said surface plane for selectively establishing an electric field that prevents electrons from entering said electron and ion detector while allowing ions to enter, and means for selectively biasing said grid means to establish said electric field.

15. Focused ion beam processing apparatus in accordance with claim 14 and further comprising, multiplexer controlling means for controlling the times when said ion beam and said electron beam impinge upon said surface plane to be during mutually exclusive time intervals.

* * * * *

REEXAMINATION CERTIFICATE (1086th)
United States Patent [19]
Doherty et al.

[11] B1 4,639,301
[45] Certificate Issued    Jun. 27, 1989

[54] FOCUSED ION BEAM PROCESSING

[75] Inventors: John A. Doherty, Sudbury; Billy W. Ward, Rockport; David C. Shaver, Carlisle, all of Mass.

[73] Assignee: Micrion Limited Partnership, Beverly, Mass.

Reexamination Request:
No. 90/001,320, Aug. 31, 1987

Reexamination Certificate for:
Patent No.: 4,639,301
Issued: Jan. 27, 1987
Appl. No.: 726,713
Filed: Apr. 24, 1985

[51] Int. Cl.⁴ ............................................. G01N 23/00
[52] U.S. Cl. .................................... 250/251; 156/643; 204/192.34; 204/298; 250/309; 250/398; 250/425; 250/427; 250/492.3
[58] Field of Search ............ 250/309, 492.2, 492.3, 250/398, 427, 492.23, 492.24; 156/643, 646; 204/298, 192.11, 192.31

[56] References Cited
U.S. PATENT DOCUMENTS 4,466,839  8/1984  Dathe et al. .................... 148/1.5
4,503,329  3/1985  Yamaguchi et al. ............. 250/309

OTHER PUBLICATIONS

*Appl. Phys. Lett.* 33(2), Jul. 15, 1978, article entitled "Depth Profiling of Sodium in $SiO_2$ Films by Secondary Ion Mass Spectrometry", by C. W. Magee and W. L. Harrington, pp. 193–196.

*J. Appl. Phys.* 50(1), Jan. 1979, article entitled "Primary-Ion Charge Compensation in SIMS Analysis of Insulators", by K. Wittmaack, pp. 493–497.

*Scanning Electron Microscopy*, 1983, article entitled "Secondary Electron and Ion Imaging in Scanning Ion Microscopy", by R. Levi-Setti, pp. 1–22.

Wargner, "Application of Focused Ion Beams", Nuclear Instruments & Methods in Physics Research, 218(1983), 355–362.

Wargner, "Applications of Focused Ion Beams to Microlithography", Solid State Technol., 5/1983, 97–103.

Bayly et al., "High Resolution . . . Sources", Scanning Electron Microscopy/1983/23–29.

Waugh et al., "The Application . . . SIMS", Vacuum, vol. 34, No. 1–2, pp. 103–106, 1984.

*Primary Examiner*—Nam X. Nguyen

[57]  ABSTRACT

An apparatus is described which makes possible the precise sputter etching and imaging of insulating and other targets, using a finely focused beam of ions produced from a liquid metal ion source. This apparatus produces and controls a submicron beam of ions to precisely sputter etch the target. A beam of electrons directed on the target neutralizes the charge created by the incident ion beam. Imaging of the target surface and ultra-precise control of the etching process is achieved by monitoring the particles that are sputtered from the target surface.

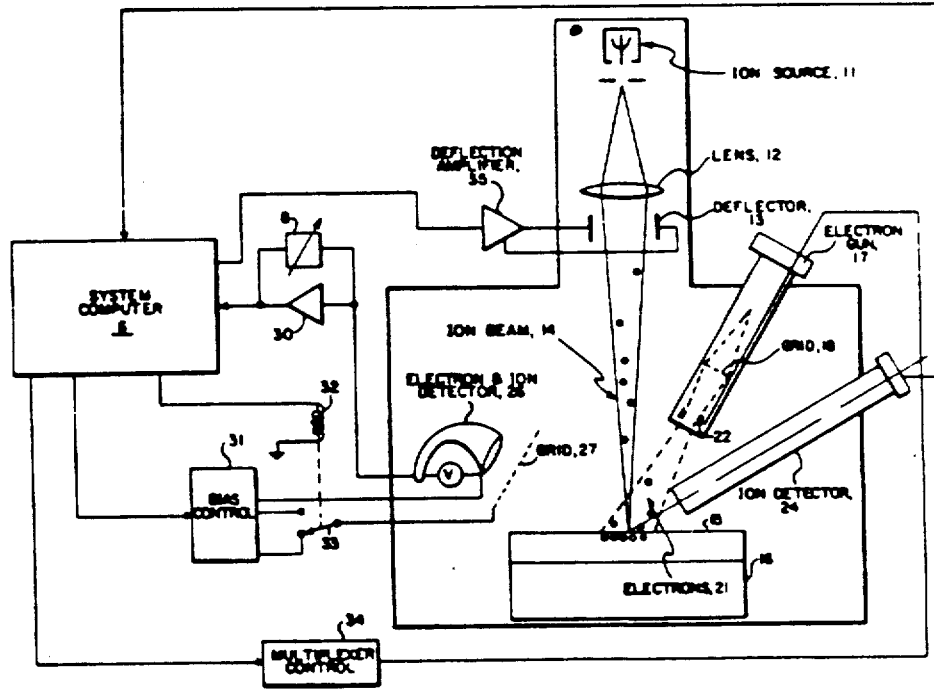

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 9 and 14 are determined to be patentable as amended.

Claims 2–8, 10–13 and 15, dependent on an amended claim, are determined to be patentable.

1. Focused ion beam processing apparatus comprising,
   a source of a finely focused ion beam of submicron shape for impingement upon a substrate surface in a predetermined surface plane,
   a source of an electron beam,
   and means for directing said electron beam toward said surface plane in a region *of area significantly less than that of said substrate surface* embracing the target point in said surface plane intersected by said ion beam for neutralizing the surface charge in said surface plane otherwise produced thereat by said ion beam to reduce defocusing and undesired deflection of said ion beam in said surface plane to allow precise positioning of said ion beam on said target point and maintenance of said submicron shape of said ion beam on said target point.

9. A method of using the focused ion beam processing apparatus in accordance with claim 1 which method includes the steps of,
   directing said finely focused ion beam of submicron shape upon said substrate surface target point in a predetermined surface plane,
   and directing said electron beam toward said surface plane in a region *of area significantly less than that of said substrate surface* embracing said target point in said surface plane intersected by said ion beam for neutralizing the surface charge in said surface plane otherwise produced thereat by said ion beam to reduce defocusing and undesired deflection of said ion beam in said surface plane to allow precise positioning of said ion beam on said target point and maintenance of said submicron shape of said ion beam on said target point.

14. Focused ion beam processing apparatus comprising,
   a source of a finely focused ion beam for impingement upon a substrate surface in a predetermined surface plane,
   a source of an electron beam,
   means for directing said electron beam toward said surface plane in a region *of area significantly less than that of said substrate surface* embracing the point in said surface plane intersected by said ion beam for neutralizing the surface charge in said surface plane otherwise produced thereat by said ion beam to reduce defocusing and undesired deflection of said ion beam in said surface plane,
   said detecting means comprising an electron and ion detector for detecting electrons and ions secondarily emitted from said substrate surface in response to impingement by said ion beam,
   grid means interposed between said electron and ion detector and said surface plane for selectively establishing an electric field that prevents electrons from entering said electron and ion detector while allowing ions to enter,
   and means for selectively biasing said grid means to establish said electric field.

* * * * *

REEXAMINATION CERTIFICATE (3756th)
United States Patent [19]
Doherty et al.

[11] 4,639,301
[45] Certificate Issued May 4, 1999

[54] FOCUSED ION BEAM PROCESSING

[75] Inventors: John A. Doherty, Sudbury; Billy W. Ward, Rockport; David C. Shaver, Carlisle, all of Mass.

[73] Assignee: Micrion Corporation, Peabody, Mass.

Reexamination Requests:
No. 90/004,510, Jan. 7, 1997
No. 90/004,662, Jun. 9, 1997

Reexamination Certificate for:
Patent No.: 4,639,301
Issued: Jan. 27, 1987
Appl. No.: 06/726,713
Filed: Apr. 24, 1985

[21] Appl. No.: 06/726,713
[51] Int. Cl.$^6$ .................................................. G01N 23/00
[52] U.S. Cl. .............. 250/251; 204/192.34; 204/298.36; 250/396 ML; 250/398; 250/427; 250/492.3
[58] Field of Search ........................ 204/192.32, 192.34, 204/298.04, 298.36; 250/396 ML, 309, 397, 398, 425, 427, 492.3, 251; 216/66, 67

[56] References Cited

U.S. PATENT DOCUMENTS 4,249,077  2/1981  Crawford ............................. 250/306

FOREIGN PATENT DOCUMENTS 2 284 980   9/1974   France.
2 363 882   9/1976   France.
52-62496    5/1977   Japan.
59-92526    5/1984   Japan.
59-201357  11/1984   Japan.

OTHER PUBLICATIONS

VG Scientific Ltd., Ion Beam Techniques for Surface Analysis (May 1983).

Bayly et al., "SIMS Micro–Analysis with a Gallium Ion Microprobe," 218 *Nuclear Instruments and Methods in Physics Research*, pp. 375–382, (1983).

Crawford, C.K. and Kudirka, P.E., "Electron Microbeam Testing for Large Microcircuit Arrays", *Record of 11th Symposium on Electron, Ion, and Laser Beam Technology* (San Francisco Press, Inc.) pp. 131–140.

Benninghoven, A., et al., Secondary Ion Mass Spectrometry, Basic Concepts, Instrumental Aspects, Applications and Trends, Chemical Analysis, vol. 86, pp. 646–647 and 881–890, (John Wiley & Sons, Inc.) 1987.

Slodzian, G., et al., "The Emission Objective lens Working as an Electron Mirror: Self Regulated Potential at the Surface of an Insulating Sample", *Secondary Ion Mass Spectrometry (SIMS V)* (Springer–Verlag, Berlin, 1986) p. 158.

McPhail, D.S., et al., "Charge Compensation During SIMS Depth Profiling of Multilayer Structures Containing Resistive and Insulating Layers", *Secondary Ion Mass Spectrometry (SIMS V)* (Springer–Verlag, Berlin, 1986) p. 343.

Hervig, R.L., et al., "Non–Oxygen Negative Primary Ion Beams for Oxygen Isotopic Analysis in Insulators", *Secondary Ion Mass Spectrometry (SIMS V)* (Springer–Verlag, Berlin, 1986) p. 152.Goldstein, J.I., et al., Scanning Electron Microscopy and X–ray Microanalysis, A Text for Biologists, Materials Scientists, and Geologists (Plenum Press, New York) 1981 pp. 3–9, 146–149.

(List continued on next page.)

*Primary Examiner*—Nam X. Nguyen

[57] ABSTRACT

An apparatus is described which makes possible the precise sputter etching and imaging of insulating and other targets, using a finely focused beam of ions produced from a liquid metal ion source. This apparatus produces and controls a submicron beam of ions to precisely sputter etch the target. A beam of electrons directed on the target neutralizes the charge created by the incident ion beam. Imaging of the target surface and ultra-precise control of the etching process is achieved by monitoring the particles that are sputtered from the target surface.

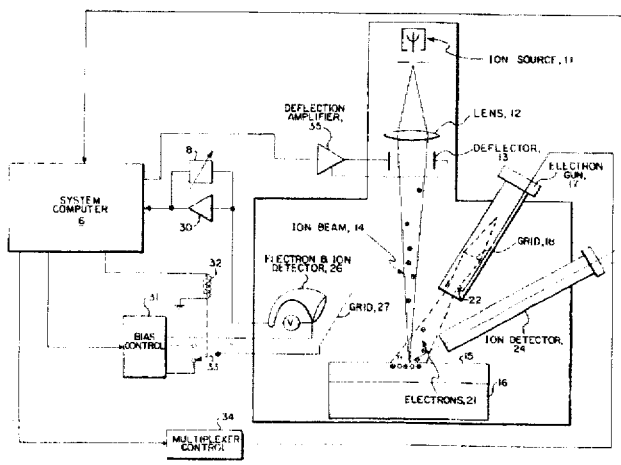

OTHER PUBLICATIONS

Crawford, C.K., "Ion Charge Neutralization Effects in Scanning Electron Microscopes", *Scanning Electron Microscopy*, pp. 11–25 (1980).

Crawford, C.K., "Charge Neutralization Using Very Low Energy Ions", *Scanning Electron Microscopy*, pp. 31–45 (Illinois, USA) (1979).

Magee, C.W. and Harrington, W.L., "Depth Profiling of Sodium in SiO2 Films by Secondary Ion Mass Spectrometry", *Appl. Phys. Lett.* vol. 33, No. 2, pp. 193–196 (Jul. 1978).

Edited by Philip F. Kane and Graydon B. Larrabee, Characterization of Solid Surfaces, (Plenum Press, New York) 1974 p. 606.

Kudirka, P.E. and Crawford, C.K., "Potential Measurement and Stabilization of an Isolated Target Using Electron Beams", *Solid–State Electronics*, vol. 15, pp. 987–992 (1972).

Reuter, W., et al., "Charging Effects in the Secondary Ion Mass Spectrometric Analysis of Targets Containing Low–Conductivity Regions", *J. Appl. Phys.*, vol. 51, No. 2, pp. 850–855 (1980).

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 3, 7, and 8 are cancelled.

Claims 1, 6, 9, 12 and 14–15 are determined to be patentable as amended.

Claims 2, 4, 5 and 10, 11, 13, dependent on an amended claim, are determined to be patentable.

New claims 16–26 and 27 are added and determined to be patentable.

1. Focused ion beam processing apparatus *for etching targets that retain electrical charge, said apparatus* comprising a source of a finely focused ion beam of submicron shape for impingement upon a substrate surface in a predetermined surface plane, *and*

*means to facilitate precise and highly controlled substrate etching of targets that retain electrical charge, said means utilizing charge neutralization and including* a source of an electron beam, and means for directing said electron beam toward said surface plane in a region of area significantly less than that of said substrate surface embracing the target point in said surface plane intersected by said ion beam, *said means for directing being adapted for providing control of said electron beam for controlling the number of electrons on the substrate surface at said region of area for neutralizing the surface charge in said surface plane otherwise produced thereat by said ion beam to reduce defocusing and undesired deflection of said ion beam in said surface plane,* to allow precise positioning of said ion beam on said target point *so that the beam position is a reliable function of electronic drive signals,* and *to allow maintenance of said submicron shape of said ion beam on said target point,*

*thereby to attain said precise and highly controlled etching of targets that retain electrical charge.*

6. Focused ion beam processing apparatus [in accordance with claim 5 and further comprising] *for etching targets that retain electrical charge, said apparatus comprising*

*a source of a finely focused ion beam of submicron shape for impingement upon a substrate surface in a predetermined surface plane,*

*means to facilitate precise and highly controlled substrate etching of targets that retain electrical charge, said means utilizing charge neutralization and including*

*a source of an electron beam, and*

*means for directing said electron beam toward said surface plane in a region of area significantly less than that of said substrate surface embracing the target point in said surface plane intersected by said ion beam, said means for directing being adapted for providing control of said electron beam for controlling the number of electrons on the substrate surface at said region of area for neutralizing the surface charge in said surface plane otherwise produced thereat by said ion beam to reduce defocusing and undesired deflection of said ion beam in said surface plane, to allow precise positioning of said ion beam on said target point, and to allow maintenance of said submicron shape of said ion beam on said target point,* detecting means for sensing secondarily emitted particles from said surface plane, said detecting means including an electron and ion detector for detecting electrons and ions secondarily emitted from said surface of a substrate in response to impingement by said ion beam, grid means interposed between said electron and ion detector and said surface plane for selectively establishing an electric field that prevents electrons from entering said electron and ion detector while allowing ions to enter, means for selectively biasing said grid means to establish said electric field, said means for directing including control means responsive to signals provided by said detecting means for controlling said ion beam and said electron beam to coact and cause said ion beam to etch in said surface plane in a desired manner and location, and multiplexer controlling means for controlling the times when said ion beam and said electron beam impinge upon said surface plane to be during mutually exclusive time intervals,

*thereby to attain said precise and highly controlled etching of targets that retain electrical charge.*

9. A method of using [the] *a* focused ion beam processing apparatus [in accordance with claim 1 which method includes] *for precise and highly controlled substrate etching of targets that retain electrical charge, said method using charge neutralization and comprising* the steps of

*providing a source of a finely focused ion beam of submicron shape for impingement upon a substrate surface in a predetermined surface plane,*

*providing a source of an electron beam,*

*providing means for directing said electron beam toward said surface plane in a region of area significantly less than that of said substrate surface embracing the target point in said surface plane intersected by said ion beam for neutralizing the surface charge in said surface plane otherwise produced thereat by said ion beam to reduce defocusing and undesired deflection of said ion beam in said surface plane, to allow precise positioning of said ion beam on said target point, and to allow maintenance of said submicron shape of said ion beam on said target point, and*

*etching in a precise and highly controlled manner targets that retain electrical charge, said etching step including* directing said finely focused ion beam of submicron shape upon said substrate surface target point in a predetermined surface plane, [and]

directing said electron beam toward said surface plane in a region of area significantly less than that of said substrate surface embracing said target point in said surface plane intersected by said ion beam, *and*

*controlling said electron beam for controlling the number of electrons on the substrate surface at said region of*

*area* for neutralizing the surface charge in said surface plane otherwise produced thereat by said ion beam to reduce defocusing and undesired deflection of said ion beam in said surface plane, to allow precise positioning of said ion beam on said target point *so that the beam position is a reliable function of electronic drive signals,* and *to allow* maintenance of said submicron shape of said ion beam on said target point,

*thereby to attain said precise and highly controlled etching of targets that retain electrical charge.*

12. A method in accordance with claim 11 and further including the step of controllably charging said substrate surface to allow imaging in a voltage contrast mode affecting the quantity and trajectories of secondary particles to enhance the contrast between materials [comprising] *of* the substrate.

14. Focused ion beam processing apparatus comprising[.]

a source of a finely focused ion beam for impingement upon a substrate surface in a predetermined surface plane, a source of an electron beam, means for directing said electron beam toward said surface plane in a region of area significantly less than that of said substrate surface embracing the point in said surface plane intersected by said ion beam for neutralizing the surface charge in said surface plane otherwise produced thereat by said ion beam to reduce defocusing and undesired deflection of said ion beam in said surface plane,

[said] detecting means comprising an electron and ion detector for detecting electrons and ions secondarily emitted from said substrate surface in response to impingement by said ion beam, grid means interposed between said electron and ion detector and said surface plane for selectively establishing an electric field that prevents electrons from entering said electron and ion detector while allowing ions to enter, and means for selectively biasing said grid means to establish said electric field.

15. Focused ion beam processing apparatus [in accordance with claim 14, and further] comprising[.]

*a source of a finely focused ion beam for impingement upon a substrate surface in a predetermined surface plane,*

*a source of an electron beam,*

*means for directing said electron beam toward said surface plane in a region of area significantly less than that of said substrate surface embracing the point in said surface plane intersected by said ion beam for neutralizing the surface charge in said surface plane otherwise produced thereat by said ion beam to reduce defocusing and undesired deflection of said ion beam in said surface plane,* multiplexer controlling means for controlling the times when said ion beam and said electron beam impinge upon said surface plane to be during mutually exclusive time intervals, detecting means comprising an electron and ion detector for detecting electrons and ions secondarily emitted from said substrate surface in response to impingement by said ion beam, grid means interposed between said electron and ion detector and said surface plane for selectively establishing an electric field that prevents electrons from entering said electron and ion detector while allowing ions to enter, and means for selectively biasing said grid means to establish said electric field.

16. Focused ion beam processing apparatus for etching targets that retain electrical charge, said apparatus comprising a source of a finely focused ion beam of submicron shape for impingement upon a substrate surface in a predetermined surface plane, means to facilitate precise and highly controlled substrate etching of targets that retain electrical charge, said means utilizing charge neutralization and including a source of an electron beam, and means for directing said electron beam toward said surface plane in a region of area significantly less than that of said substrate surface embracing the target point in said surface plane intersected by said ion beam for neutralizing the surface charge in said surface plane otherwise produced thereat by said ion beam to reduce defocusing and undesired deflection of said ion beam in said surface plane, to allow precise positioning of said ion beam on said target point, and to allow maintenance of said submicron shape of said ion beam on said target point, and multiplexer controlling means for controlling the times when said ion beam and said electron beam impinge upon said surface plane to be during mutually exclusive time intervals, thereby to attain said precise and highly controlled etching of targets that retain electrical charge.

17. Focused ion beam processing apparatus in accordance with claim 16 further comprising detecting means for sensing secondarily emitted particles from said surface plane, and control means responsive to signals provided by said detecting means for controlling said ion beam and said electron beam to coact and cause said ion beam to etch in said surface plane in a desired manner and location.

18. Focused ion beam processing apparatus in accordance with claim 17 wherein said detecting means comprises a secondary ion mass detector for sensing the types of ions leaving a substrate in response to impingement on the substrate surface by said ion beam.

19. Focused ion beam processing apparatus in accordance with claim 17 wherein said detecting means comprises an electron and ion detector for detecting electrons and ions secondarily emitted from said surface of a substrate in response to impingement by said ion beam.

20. Focused ion beam processing apparatus in accordance with claim 19 further comprising grid means interposed between said electron and ion detector and said surface plane for selectively establishing an electric field that prevents electrons from entering said electron and ion detector while allowing ions to enter, and means for selectively biasing said grid means to establish said electric field.

21. Focused ion beam processing apparatus in accordance with claim 16 wherein said ion beam and said electron beam produce currents with the electron beam current and current density being much greater and much less than the ion beam current and current density respectively.

22. Focused ion beam processing apparatus in accordance with claim 16 further comprising a substrate having said substrate surface in said predetermined surface plane, said substrate being predominantly insulating material and responding to impingement of said ion beam upon said surface by developing a thin conductive layer in said surface, said conducting surface presenting an increased surface conducting area for flood electrons from said source of an electron beam to reach the area of primary ion beam etching on said surface by said ion beam to neutralize the charge thereat.

23. Focused ion beam processing apparatus for etching targets that retain electrical charge, said apparatus comprising a source of a finely focused ion beam of submicron shape for impingement upon a substrate surface in a predetermined surface plane, means to facilitate precise and highly controlled substrate etching of targets that retain electrical charge, said means utilizing charge neutralization and including a source of an electron beam, and means for directing said electron beam toward said surface plane in a region of area significantly less than that of said substrate surface embracing the target point in said surface plane intersected by said ion beam, said means for directing being adapted for providing control of said electron beam for controlling the number of electrons on the substrate surface at said region of area for neutralizing the surface charge in said surface plane otherwise produced thereat by said ion beam to reduce defocusing and undesired deflection of said ion beam in said surface plane, to allow precise positioning of said ion beam on said target point, and to allow maintenance of said submicron shape of said ion beam on said target point, and multiplexer controlling means for controlling the times when said ion beam and said electron beam impinge upon said surface plane to be during mutually exclusive time intervals, thereby to attain said precise and highly controlled etching of targets that retain electrical charge.

24. Focused ion beam processing apparatus for etching targets that retain electrical charge, said etching being in the nature of repair operations, said apparatus comprising a source of a finely focused ion beam of submicron shape for impingement upon a substrate surface in a predetermined surface plane, and means to facilitate precise and highly controlled substrate etching of targets that retain electrical charge, said etching being in the nature of repair operations, said means to facilitate utilizing charge neutralization and including a source of an electron beam, and means for directing said electron beam toward said surface plane in a region of area significantly less than that of said substrate surface embracing the target point in said surface plane intersected by said ion beam, said means for directing being adapted for providing control of said electron beam for controlling the number of electrons on the substrate surface at said region of area for neutralizing the surface charge in said surface plane otherwise produced thereat by said ion beam to reduce defocusing and undesired deflection of said ion beam in said surface plane, to allow precise positioning of said ion beam on said target point so that the beam position is a reliable function of electronic drive signals, and to allow maintenance of said submicron shape of said ion beam on said target point, thereby to attain said precise and highly controlled etching of targets that retain electrical charge.

25. A method of using a focused ion beam processing apparatus for precise and highly controlled substrate etching of targets that retain electrical charge, said method using charge neutralization and comprising the steps of providing a source of a finely focused ion beam of submicron shape for impingement upon a substrate surface in a predetermined surface plane, providing a source of an electron beam, providing means for directing said electron beam toward said surface plane in a region of area significantly less than that of said substrate surface embracing the target point in said surface plane intersected by said ion beam for neutralizing the surface charge in said surface plane otherwise produced thereat by said ion beam to reduce defocusing and undesired deflection of said ion beam in said surface plane, to allow precise positioning of said ion beam on said target point, and to allow maintenance of said submicron shape of said ion beam on said target point, and etching in a precise and highly controlled manner targets that retain electrical charge, said etching being in the nature of repair operations, said etching step including directing said finely focused ion beam of submicron shape upon said substrate surface target point in a predetermined surface plane, directing said electron beam toward said surface plane in a region of area significantly less than that of said substrate surface embracing said target point in said surface plane intersected by said ion beam, and controlling said electron beam for controlling the number of electrons on the substrate surface at said region of area for neutralizing the surface charge in said surface plane otherwise produced thereat by said ion beam to reduce defocusing and undesired deflection of said ion beam in said surface plane, to allow precise positioning of said ion beam on said target point so that the beam position is a reliable function of electronic drive signals, and to allow maintenance of said submicron shape of said ion beam on said target point.

26. Focused ion beam processing apparatus for etching targets that retain electrical charge, said apparatus comprising a source of a finely focused ion beam of submicron shape for impingement upon a substrate surface in a predetermined surface plane, and means to facilitate precise and highly controlled etching of targets that retain electrical charge, said means utilizing charge neutralization and including a source of an electron beam, and means for directing said electron beam toward said surface plane in a region of area significantly less than that of said substrate surface embracing the target point in said surface plane intersected by said ion beam, said means for directing being adapted for providing control of said electron beam for neutralizing the surface charge in said surface plane otherwise produced thereat by said ion beam to reduce defocusing and undesired deflection of said ion beam in said surface plane, to allow precise positioning of said ion beam on said target point so that the beam position is a reliable function of electronic drive signals, to allow control of voltage contrast, and to allow maintenance of said submicron shape of said ion beam on said target point, thereby to attain said precise and highly controlled etching of targets that retain electrical charge.

27. A method of using a focused ion beam processing apparatus for precise and highly controlled substrate etching of targets that retain electrical charge, said method using charge neutralization and comprising the steps of providing a source of a finely focused ion beam of submicron shape for impingement upon a substrate surface in a predetermined surface plane, providing a source of an electron beam, providing means for directing said electron beam toward said surface plane in a region of area significantly less than that of said substrate surface embracing the target point in said surface plane intersected by said ion beam for neutralizing the surface charge in said surface plane otherwise produced thereat by said ion beam to reduce defocusing and undesired deflection of said ion beam in said surface plane, to allow precise positioning of said ion beam on said target point, to allow control of voltage contrast, and to allow maintenance of said submicron shape of said ion beam on said target point, and etching in a precise and highly controlled manner targets that retain electrical charge, said etching step including directing said finely focused ion beam of submicron shape upon said substrate surface target point in a predetermined surface plane, directing said electron beam toward said surface plane in a region of area significantly less than that of said substrate surface embracing said target point in said surface plane intersected by said ion beam, and controlling said electron beam for neutralizing the surface charge in said surface plane otherwise produced by said ion beam to reduce defocusing and undesired deflection of said ion beam in said surface plane, to allow precise positioning of said ion beam on said target point so that the beam position is a reliable function of electronic drive signals, to allow control of voltage contrast, and to allow maintenance of said submicron shape of said ion beam on said target point.

* * * * *